(12) United States Patent
Wang

(10) Patent No.: US 11,354,098 B2
(45) Date of Patent: Jun. 7, 2022

(54) CONFIGURABLE NON-VOLATILE ARITHMETIC MEMORY OPERATORS

(71) Applicant: SYNERGER INC., ZheJiang (CN)

(72) Inventor: Lee Wang, Diamond Bar, CA (US)

(73) Assignee: SYNERGER INC., Zhejiang (CN)

( * ) Notice: Subject to any disclaimer, the term of this patent is extended or adjusted under 35 U.S.C. 154(b) by 440 days.

(21) Appl. No.: 16/516,620

(22) Filed: Jul. 19, 2019

(65) Prior Publication Data

US 2021/0019114 A1 Jan. 21, 2021

(51) Int. Cl.
| | |
|---|---|
| *G06F 7/523* | (2006.01) |
| *H03K 19/20* | (2006.01) |
| *H03K 19/21* | (2006.01) |
| *G06F 7/502* | (2006.01) |
| *G11C 13/00* | (2006.01) |
| *G11C 11/16* | (2006.01) |

(52) U.S. Cl.
CPC ............. *G06F 7/523* (2013.01); *G06F 7/502* (2013.01); *H03K 19/20* (2013.01); *H03K 19/21* (2013.01); *G11C 11/16* (2013.01); *G11C 13/0004* (2013.01); *G11C 13/0011* (2013.01)

(58) Field of Classification Search
CPC ... H03K 19/20–217; G06F 7/50; G06F 7/501; G06F 7/502; G06F 7/523–5318; G06F 15/7821; G06G 7/00–46
See application file for complete search history.

(56) References Cited

U.S. PATENT DOCUMENTS

| | | | |
|---|---|---|---|
| 9,048,137 B2 | 6/2015 | Wang | |
| 2013/0279266 A1* | 10/2013 | Wang | ................. G11C 14/0018 365/185.24 |
| 2016/0203868 A1* | 7/2016 | Wang | ................... G11C 15/046 365/49.17 |
| 2019/0205095 A1* | 7/2019 | Gupta | ................... G06F 7/5443 |

OTHER PUBLICATIONS

Digital Principles and System Design, https://www.brainkart.com/subject/Digital-Principles-and-System-Design_100/, 2016 (Year: 2016).*

* cited by examiner

*Primary Examiner* — Emily E Larocque
(74) *Attorney, Agent, or Firm* — Muncy, Geissler, Olds & Lowe, P.C.

(57) ABSTRACT

The Non-Volatile Arithmetic Memory Operator (NV-AMO) including a non-volatile memory cell for storing non-volatile data and a first input terminal for receiving volatile variable data is applied to perform the arithmetic operations over the volatile variable data and the non-volatile data. The NV-AMO can also be configured multiple-times for new computations. The constructions of NV-AMO in Arithmetic Logic Units (ALU) can be applied in DSP (Digital Signal Processor) computations and DNN (Deep Neural Network) computations.

27 Claims, 10 Drawing Sheets

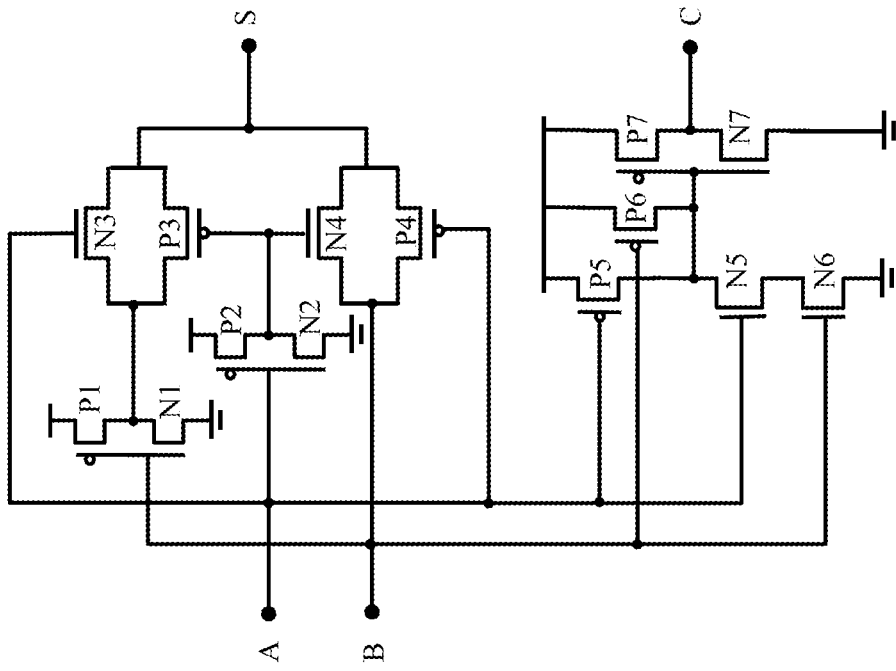
MOSFET Device Schematics
Fig. 1c (prior art)
Logic gates
Fig. 1b (prior art)
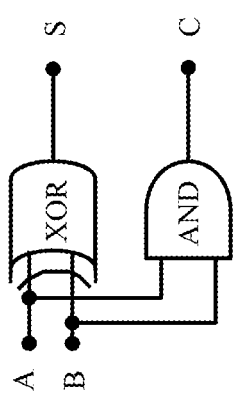
Bit addition Truth Table
Fig. 1a (prior art)

| A | B | M |
|---|---|---|
| 0 | 0 | 0 |
| 0 | 1 | 0 |
| 1 | 0 | 0 |
| 1 | 1 | 1 |
Bit multiplication truth table
Fig. 2a (prior art)
Logic gates
Fig. 2b (prior art)
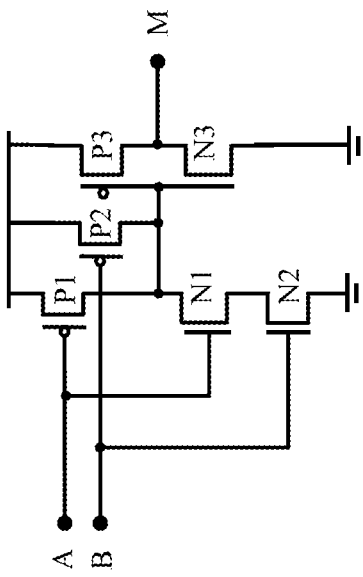
MOSFET Device Schematics
Fig. 2c (prior art)

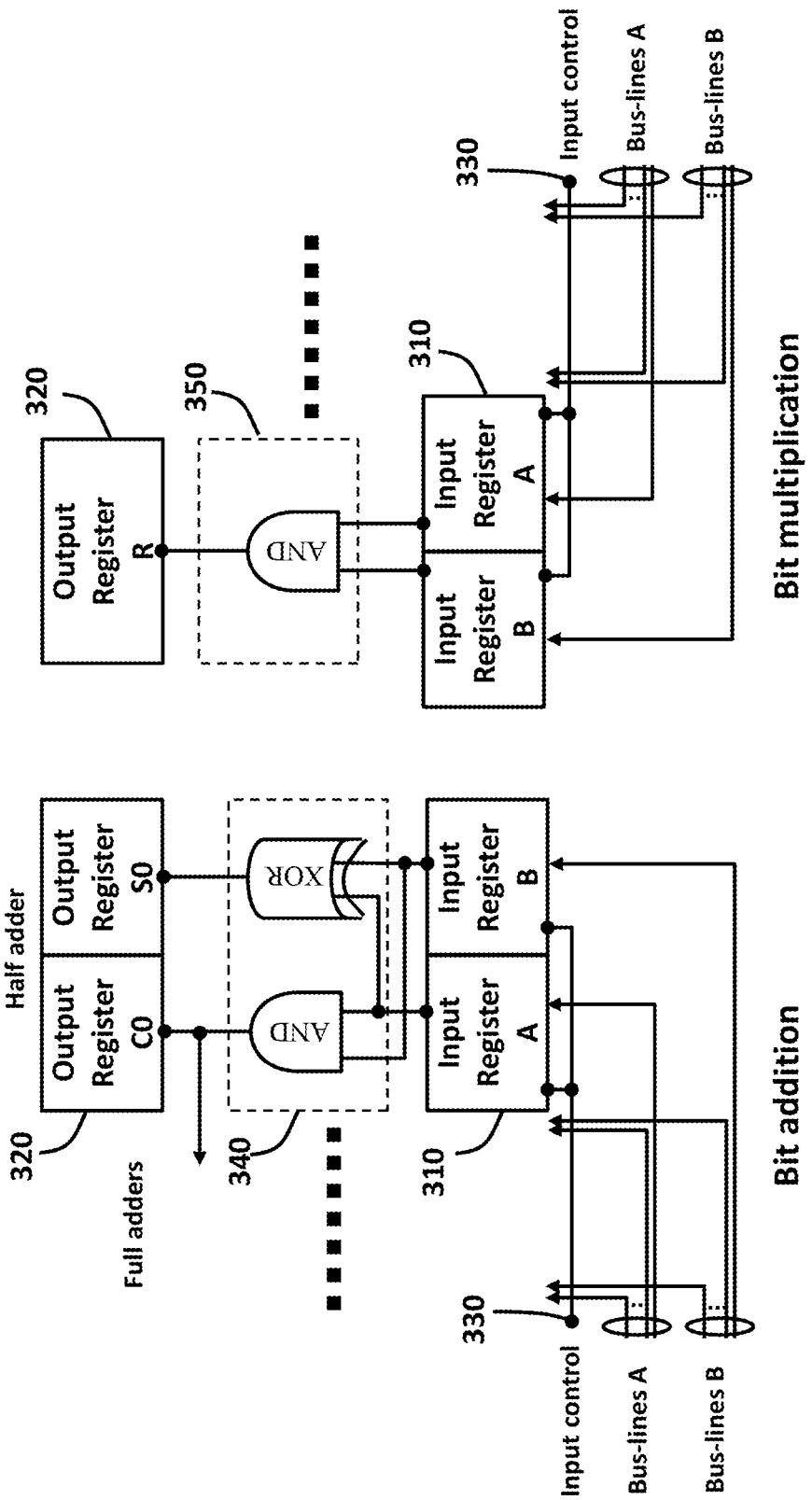

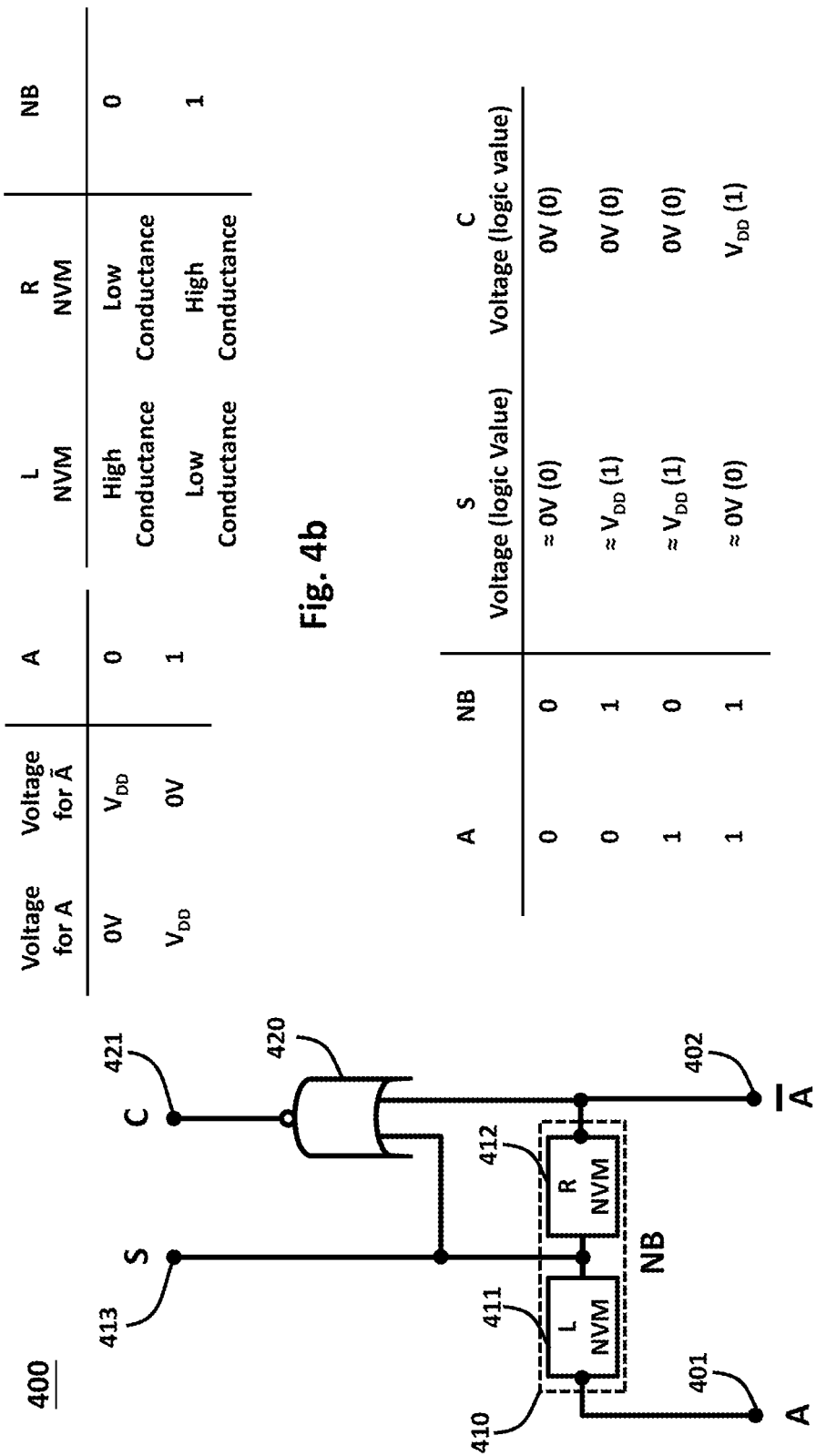

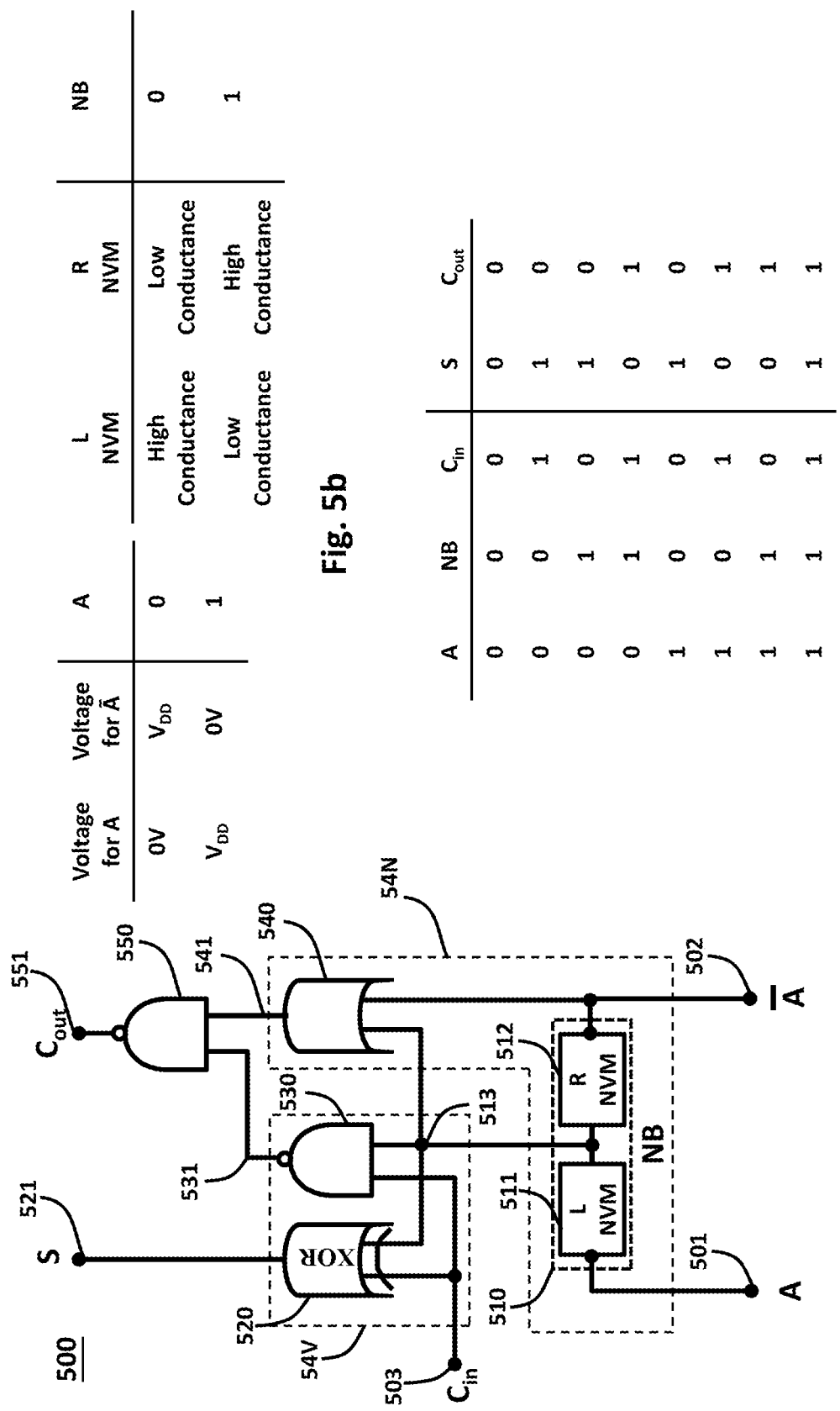

$$S = (A \oplus B) \oplus C_{in}$$

$$C_{out} = A \cdot B + (C_{in} \cdot (A \oplus B))$$

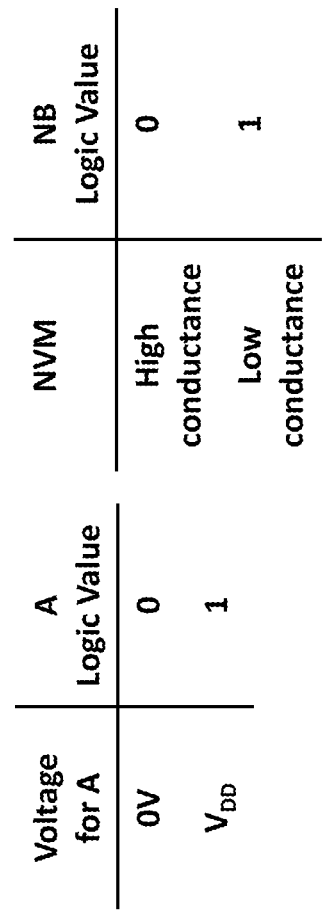
Fig. 7c
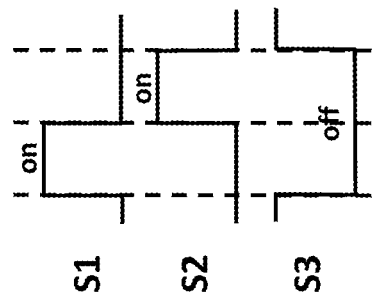
Fig. 7d
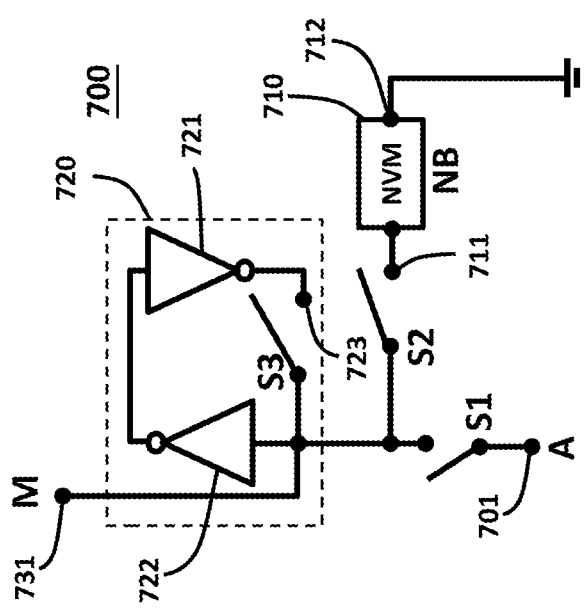
Fig. 7a
Fig. 7b

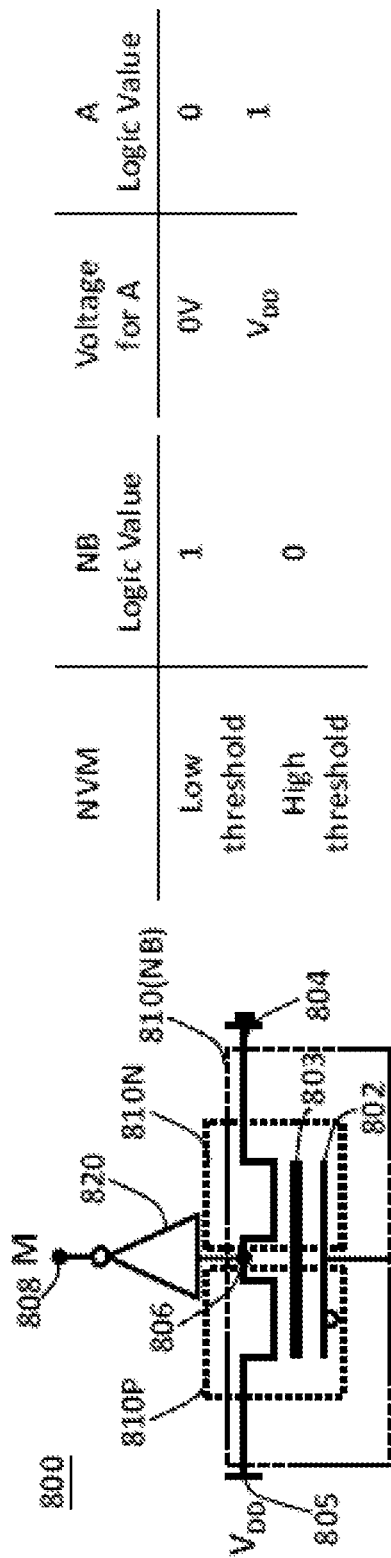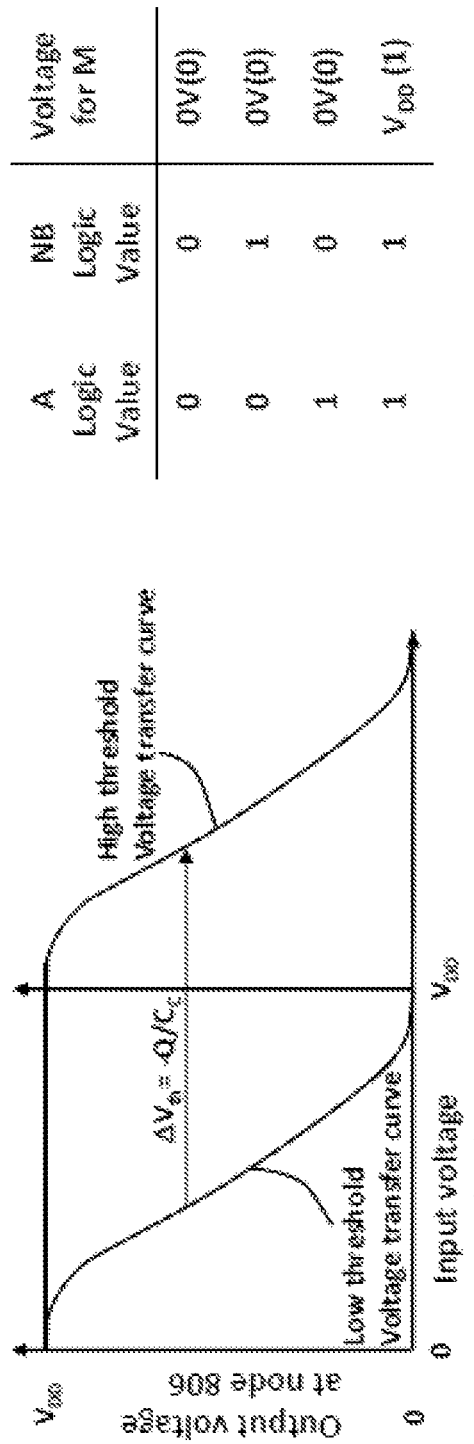
Fig. 8a
Fig. 8b
Fig. 8c
Fig. 8d

CONFIGURABLE NON-VOLATILE ARITHMETIC MEMORY OPERATORS

BACKGROUND OF THE INVENTION

Field of the Invention

The invention is related to the hardware components for arithmetic operators in digital circuitries. In particular, the hardware arithmetic components comprising Non-Volatile Memory (NVM) devices storing non-volatile data are applied for the arithmetic operations between non-volatile data and volatile variable data. In contrast to the conventional arithmetic operator comprising sole combinational logic gates with no data memory storage, the Non-Volatile Arithmetic Memory Operator (NV-AMO) saves computational power by the self-storage of non-volatile data in the NVM devices of the NV-AMO. Meanwhile the multiple time configurability of the non-volatile devices in the NV-AMO can also provide the flexibility of altering non-volatile data for new computations.

Description of the Related Art

In digital computations, bit-addition and bit-multiplication are the basic operations for arithmetic computations. The basic operations are done by applying digital data voltage signals into the circuits of the combinational logic gates. Logic gates such as NAND, OR, NOT, and XOR are built with Complementary Metal Oxide Semiconductor (CMOS) devices comprising series-connected P-type devices and N-type MOSFET devices. FIG. 1 shows the digital operation for bit-addition (half adder): (a) the truth table, (b) the logic gate schematics, and (c) MOSFET device schematics, and FIG. 2 shows the digital operation for bit-multiplication: (a) the truth table, (b) the logic gate schematics, and (c) MOSFET device schematics, respectively.

As illustrated in FIGS. 3a and 3b, the voltage signals of the input bit data from the two input-registers 310 are passed to the addition operator 340 and the multiplication operator 350 for the computed bit data stored in the output data register(s) 320 for the bit addition and the bit multiplication, respectively. For the two input operations, two sets of bit data strings with multiple bits, for example 8-integer bits or 32-bit floating point, need to be fetched from memory units (not shown) through the multiple connecting bus-lines A and B to the two sets of input registers 310 simultaneously by activating the input controls 330 of the multiple-bit registers 310. It is most likely that the consumed power for the arithmetic computation process are mainly due to the data fetching process from memory units such as powers from the memory data sensing, buffering, and the bus-line charging/discharging, besides the minor switching power from the logic gate operands and control switches. Computer chip designers have been trying to save the computational power by reducing the numbers of accessing memory units and buffering, and shortening the data signals propagation paths from memory units to the Arithmetic Logic Unit (ALU). On the other hand, for the common arithmetic computation, two sets of inputted data are usually uploaded to the input registers 310 from memory units through two sets of connecting bus-lines A and B. One would expect the power consumption of arithmetic computations can be significantly reduced, if only one set of inputted data is fetched from the memory units. Meanwhile many arithmetic computations in digital processing are indeed operated in term of input variables and fixed parameters (hardly changed for multiple times of computations), for example, the parameters obtained from cosine function values in a Digital Signal Processor (DSP) or from the convolutional function values in a Deep Neural Network (DNN) processor. Therefore for the main aspect of this invention for saving arithmetic computation power, we propose a new type of arithmetic operations for one input volatile data and one configurable non-volatile data, where the configurable non-volatile data stored in the non-volatile memory devices of the NV-AMO are computed with one set of input variable data.

In another aspect of this invention, since the non-volatile memory devices in the NV-AMO can be configured multiple times, the new computations can be done by reconfiguring the non-volatile data in the NV-AMO.

SUMMARY OF THE INVENTION

Throughout the specification and claims, the following terms take the meanings explicitly associated herein, unless the context clearly dictates otherwise. The term "a bit arithmetic operation" refers to a single-bit arithmetic operation that includes, without limitation, a bit-addition operation, a bit-subtraction operation, and a bit-multiplication. The term "arithmetic computation" refers to a multiple-bit arithmetic operation that includes, without limitation, multiple-bit addition, multiple-bit subtraction, and multiple-bit multiplication.

FIG. 4a shows a schematic diagram of a 1-bit NV-AMO for realizing a 1-bit non-volatile half adder according to one embodiment of the invention. FIG. 4b shows the definition of volatile data and non-volatile data for the 1-bit NV-AMO in FIG. 4a. FIG. 4c shows the input voltage signals/logic values and the output voltage signals/logic values for the 1-bit NV-AMO in FIG. 4a. In FIG. 4a, a 1-bit NV-AMO 400 for realizing a 1-bit non-volatile half adder includes a complementary non-volatile memory pair 410 and a NOR gate 420. The complementary non-volatile memory pair 410 consists of the "right" non-volatile memory element 412 and the "left" non-volatile memory element 411 connected to form the output S at node 413 with their input nodes 401 and 402 respectively connected to the variable datum input A and its complementary input $\overline{A}$. The voltage signals for the output S at node 413 represent the sum bit of the single bit non-volatile half adder 400. The sum bit S of the complementary non-volatile memory pair 410 and the complementary data input $\overline{A}$ are connected to the two inputs of an NOR gate 420 to obtain the carrier bit C at node 421 for the NV-AMO 400. Conventionally the voltage signals for digital volatile data are defined as "0 V" for "logic value "0" and "VDD" for logic value "1", respectively. The non-volatile data in the NV-AMO 400 can be defined by the conducting states of the complementary non-volatile memory elements. According to FIG. 4b, the non-volatile datum "0" is defined as the "left" non-volatile memory element 411 connected with the volatile datum input A at node 401 in the high conductance state and the "right" non-volatile memory element 412 connected with the volatile datum complementary input $\overline{A}$ at node 402 in the low conductance state. While the non-volatile datum "1" is defined as the "left" non-volatile memory element 411 connected with the volatile datum input A at node 401 in the low conductance state and the "right" non-volatile memory element 412 connected with the volatile complementary datum input $\overline{A}$ at node 402 in the high conductance state. For the condition of "high" conductance>>"low" conductance, the voltage potentials for S at node 413 are approximately close to the voltage potentials passed by the "high" conductance of the non-volatile memory element with the applied voltages at the input node. That is, the output voltage potentials for S at node 413 are approximately equal to the voltages passed by the left "high" conductance non-volatile element representing the non-volatile datum "0" with the input voltages for A at node 401, and by the right "high" conductance non-volatile element representing non-volatile datum "1" with the complementary input voltages for $\overline{A}$ at node 402, respectively. By the definition of logic values shown in FIG. 4b, the logic gate function of the complementary non-volatile memory pair 410 for the logic operation of the volatile data and the non-volatile data behaves like the function of conventional XOR-gate for two logic variable inputs. The voltage signals representing the carrier bit C at node 421 from the output of an NOR gate 420 are generated by the two inputs of S and $\overline{A}$. FIG. 4c is the summary of the output voltage signals and their correspondent logic states for the half adder operations according to the input volatile data and the configured non-volatile data.

FIG. 5a shows the schematics of a 1-bit NV-AMO for realizing a 1-bit non-volatile full adder according to one embodiment of the invention. FIG. 5b shows the definition of volatile data and non-volatile data for the 1-bit NV-AMO in FIG. 5a. FIG. 5c shows the input voltage signals/logic values and the output voltage signals/logic values for the 1-bit NV-AMO in FIG. 5a. In FIG. 5a, the complementary non-volatile memory pair 510 consists of the "right" non-volatile memory element 512 and the "left" non-volatile memory element 511 connected to form an output at node 513 with their input nodes 501 and 502 respectively connected to the volatile datum input A and its complementary data input $\overline{A}$. The output at node 513 of the complementary non-volatile memory pair 510 is connected to the input of XOR gate 520 and the input of NAND gate 530 with their other inputs from carry-in bit Cin at node 503, respectively. The output of XOR gate 520 is the sum bit S at node 521 for the 1-bit NV-AMO 500. The carry out bit Cout at node 551 for the single bit non-volatile full adder 500 is the output of NAND gate 550, whose two inputs are the output of NAND gate 530 at the output node 531 and the output of OR gate 540 at the output node 541. The two inputs of OR gate 540 are the output at node 513 of the complementary non-volatile memory pair 510 and the complementary datum input $\overline{A}$ at node 502. Basically, the 1-bit NV-AMO 500 for realizing the 1-bit non-volatile full adder is constructed by two half adders, namely the non-volatile half adder 54N and the volatile half adder 54V, and one NAND gate 550. Similarly, the conventional full adder 600 can be constructed by two half adders 610/620 and one OR gate 630 as shown in FIG. 6: (a) the truth table, (b) the logic equation, and (c) the logic gate schematics. Note that the logic output value of an OR gate with the two logic inputs is equivalent to the logic output value of an NAND gate with two reverse logic inputs.

FIG. 7a shows a schematic diagram of a 1-bit NV-AMO for bit-multiplication according to an embodiment of the invention. FIG. 7b shows the operational switching timing sequence for the 1-bit NV-AMO in FIG. 7a. FIG. 7c shows the definition of volatile data and non-volatile data for the 1-bit NV-AMO in FIG. 7a. FIG. 7d shows the input voltage signals/logic values and the output voltage signals/logic values for the 1-bit NV-AMO in FIG. 7a. In FIG. 7a, a 1-bit NV-AMO 700 for bit-multiplication comprises a non-volatile memory device 710, a data latch 720 and two switches S1 and S2. The non-volatile memory device 710 with one node 712 tied to the ground voltage (0 V) and the other node 711 connected to switch S2. The two inverters 721 and 722 are latched by closing switch S3 to form the data latch 720 for the output bit storage. The resultant logic values M for the bit-multiplication are represented by the voltage signals at the output node 731 of the data latch 720. When switch S1 is turned on, the voltage signals of data $\overline{A}$ at node 701 are passed to the output node 731 and the latch 720 consisting of two series-connected inverters 721 and 722 with switch S3 off. Switch S2 is then turned on with switches S1/S3 off for a short period of time for the volatile data A/non-volatile data NB multiplication process to occur. After the bit-multiplication process switch S3 with both switches S1/S2 off is then turned on to latch the final voltage signals in the latch 720. The switching time sequence for switches S1, S2, and S3 is shown in FIG. 7b. According to the logic value definition in FIG. 7c, the voltage signal $V_{DD}$ of logic "1" for M at node 731 is obtained only for the case of volatile datum "A=1" with the input voltage signal $V_{DD}$ and non-volatile logic datum "NB=1" for the "low" conductance state of non-volatile memory device 710. It can be understood by the followings: (1) the input voltage signal $V_{DD}$ for volatile datum "1" is first passed to node 731 with switch S1 on and switches S2/S3 off; (2) when switch S2 is turned on with switches S1/S3 off for the short time period the voltage potential at node 731 is approximately retained at $\approx V_{DD}$ due to the "low" conductance of the non-volatile memory device 710 slowing the voltage potential to discharge to the connected ground; (3) the latch 720 latches the voltage signal from $V_{DD}$ to $V_{DD}$ at the output node 731 by closing switch S3 with S1/S2 off. In the cases of the input datum "A=0" with the input voltage signal 0 V, and either "NB=0" ("high" conductance state) or "NB=1" ("low" conductance state), the output voltage for M at node 731 of the latch 720 always remains at 0 V for the whole process. In the case of input datum "A=1" with the input voltage signal $V_{DD}$ and "NB=0" for the "high" conductance state, the voltage potential for M at the output node 731 of the latch 720 discharges rapidly to $\approx 0$ V for the short time period due to the "high" conductance of the non-volatile memory device 710 connected to the ground voltage. The input/output voltage signals and their correspondent logic values are summarized in FIG. 7d.

FIG. 8a shows a schematic diagram of a 1-bit NV-AMO for bit-multiplication using a floating-gate non-volatile inverter device according to another embodiment of the invention. FIG. 8b shows the input/output voltage transfer curve characteristics for the floating-gate non-volatile inverter device in FIG. 8a. FIG. 8c shows the definition of volatile data and non-volatile data for the 1-bit NV-AMO in FIG. 8a. FIG. 8d shows the input voltage signals/logic values and the output voltage signals/logic values for the 1-bit NV-AMO in FIG. 8a. In FIG. 8a, a 1-bit NV-AMO 800 for bit-multiplication includes a non-volatile float-gate inverter device 810 and an inverter 820. The voltage input node 801 for the volatile data $\overline{A}$ are connected to the control gate 802 of the non-volatile float-gate inverter device 810, where a PMOSFET device 810P and an NMOSFET device 810N are series-connected with a common floating gate 803. The source electrode 804 of the NMOSFET device 810N and the source electrode 805 of PMOSFET device 810P are connected to the ground voltage (0 V) and the high voltage bias $V_{DD}$, respectively. The output node 806 of the non-volatile float-gate inverter device 810 is formed by the joined drain electrodes of the series-connected PMOSFET device 810P and NMOSFET device 810N. The control gate 802 of the non-volatile float-gate inverter device 810 is capacitively coupled with the common floating gate 803 with a capacitance $C_c$. The output node 806 of the nonvolatile floating-gate inverter device 810 is further connected to the input node of an inverter 820 to invert the voltage signals for the voltage signals of the desired logic value M at node 808. The input/output voltage transfer curves for the floating-gate non-volatile inverter device 810 are shown in FIG. 8b. The input/output transfer curves are parallel shifted from the intrinsic curve (no charges stored in the floating gate) by $\Delta V_{th}=-Q/C_c$, where Q is the amount of stored charges in the floating gate and $C_c$ is the coupling capacitance between the control gate 802 and the common floating gate 803. The non-volatile inverter device 810 can be programmed to a high threshold voltage state by injecting electrons into the floating gate 803 as the transfer curve shifted to the "right" curve in FIG. 8b. The "left" transfer curve is the input/output voltage transfer curve for the "low" threshold voltage state with no charges (or slight positive charges) in the floating gate 803 for the floating-gate non-volatile inverter device 810. We define the "low" threshold voltage state for the non-volatile datum NB="1" and the "high" threshold voltage state for non-volatile datum NB="0", respectively. For the datum "A=1" with the input voltage $V_{DD}$ and NB="1" for the "low" threshold voltage state according to the "left" transfer curve in FIG. 8b, the output voltage at node 806 is 0 V. For the datum "A=0" with the input voltage 0 V and NB="1" for the "low" threshold voltage state according to the "left" transfer curve in FIG. 8b, the output voltage at node 806 is $V_{DD}$. According to the "right" transfer curve in FIG. 8b for the "high" threshold voltage state for NB="0", the output voltage at node 806 of the floating-gate inverter 810 are always $V_{DD}$ for both of the input voltages $V_{DD}$ (A="1") and 0 V (A="0"). The voltage signals at node 806 are then further inverted by the inverter 820 to obtain the desired logic value M at node 808. Basically the logic function of the non-volatile inverter device 810 for the non-volatile bit datum and input volatile bit datum is equivalent to the AND logic gate function for the two volatile bit datum inputs. The input/output voltage signals and their correspondent logic values are summarized in FIG. 8d.

The non-volatile memory devices/elements in FIGS. 4a, 5a, 7a and 8a include, without limitation, phase-change memory (PCM) devices, Nano-RAM devices, magnetoresistive random access memory (MRAM) devices, resistive random access memory (ReRAM) devices and conductive bridging RAM (CBRAM) devices.

BRIEF DESCRIPTION OF THE DRAWINGS

For a better understanding of the present invention and to show how it may be carried into effect, reference will now be made to the following drawings, which show the preferred embodiment of the present invention, in which:

FIG. 1a shows the true table for bit addition (or a conventional half adder).

FIG. 1b shows the combinational logic gates for the conventional half adder associated with FIG. 1a.

FIG. 1c shows MOSFET device schematics for the conventional half adder in FIG. 1b.

FIG. 2a shows the truth table for bit multiplication (or a conventional AND gate).

FIG. 2b shows the combinational logic gates for the conventional AND gate associated with FIG. 2a.

FIG. 2c shows MOSFET device schematics for the conventional AND gate in FIG. 2b.

FIG. 3a illustrates two input volatile bit data in the two input registers are passed to the addition operator for the computed bit data stored in the output data registers.

FIG. 3b illustrates two input volatile bit data in the two input registers are passed to the multiplication operator for the computed bit data stored in the output data registers.

FIG. 4a shows schematics of a 1-bit NV-AMO for realizing a 1-bit non-volatile half adder according to one embodiment of the invention.

FIG. 4b shows the definition of volatile data and non-volatile data for the 1-bit NV-AMO in FIG. 4a.

FIG. 4c shows the input voltage signals/logic values and the output voltage signals/logic values for the 1-bit NV-AMO in FIG. 4a.

FIG. 5a shows the schematics of a 1-bit NV-AMO for realizing a 1-bit non-volatile full adder according to one embodiment of the invention.

FIG. 5b shows the definition of volatile data and non-volatile data for the 1-bit NV-AMO in FIG. 5a.

FIG. 5c shows the input voltage signals/logic values and the output voltage signals/logic values for the 1-bit NV-AMO in FIG. 5a.

FIG. 6a shows the truth table for a conventional full adder constructed by two half adder.

FIG. 6b shows the logic equation for the full adder in FIG. 6a.

FIG. 6c shows logic gate schematics for the full adder in FIG. 6a.

FIG. 7a shows a schematic diagram of a 1-bit NV-AMO for bit-multiplication according to an embodiment of the invention.

FIG. 7b shows the operational switching timing sequence for the 1-bit NV-AMO in FIG. 7a.

FIG. 7c shows the definition of volatile data and non-volatile data for the 1-bit NV-AMO in FIG. 7a.

FIG. 7d shows the input voltage signals/logic values and the output voltage signals/logic values for the 1-bit NV-AMO in FIG. 7a.

FIG. 8a shows a schematic diagram of 1-bit NV-AMO for bit-multiplication using a floating-gate non-volatile inverter device according to another embodiment of the invention.

FIG. 8b shows the input/output voltage transfer curve characteristics for the floating-gate non-volatile inverter device in FIG. 8a.

FIG. 8c shows the definition of volatile data and non-volatile data for the 1-bit NV-AMO in FIG. 8a.

FIG. 8d shows the input voltage signals/logic values and the output voltage signals/logic values for the 1-bit NV-AMO in FIG. 8a.

FIG. 10 shows a schematic diagram of an nonvolatile arithmetic memory operator module for n-bit multiplication using SGLNVM devices for storing non-volatile data according to the operational procedure in FIG. 7a.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

In one embodiment we apply the Scalable Gate Logic Non-Volatile Memory (SGLNVM) devices disclosed in U.S. Pat. No. 9,048,137 B2 (the disclosure of which is incorporated herein by reference in its entirety) to the NV-AMOs for the arithmetic computations. Since the SGLNVM devices are fabricated with the same CMOS logic process technologies as for the digital IC chip fabrications, it is convenient to implement the invented NV-AMOs for arithmetic computations with the SGLNVM devices in Arithmetic Logic Unit (ALU).

Figures 6A, 6B, 6C:
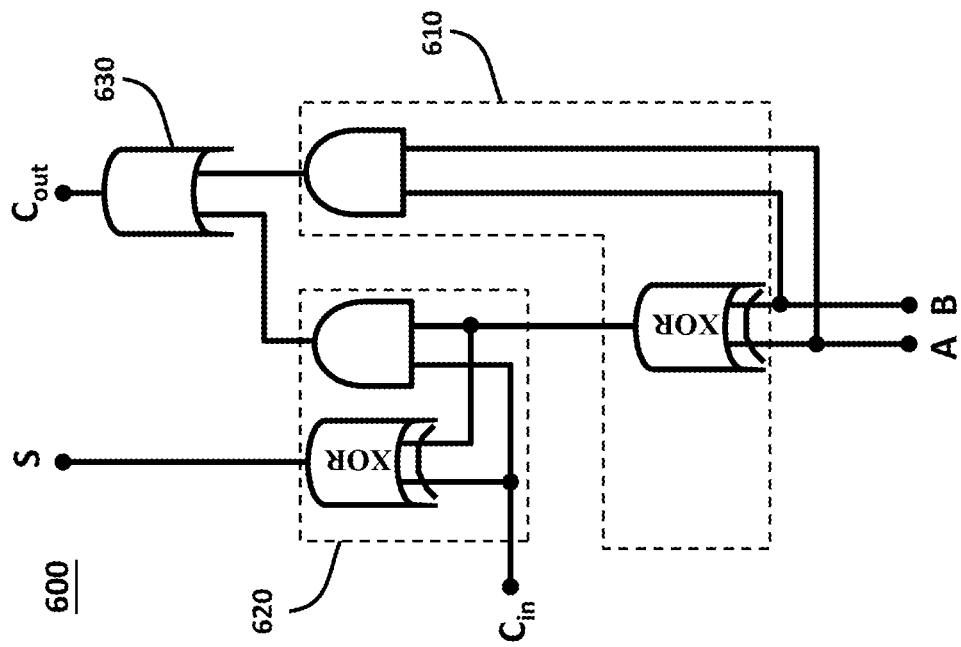
Figure 9:
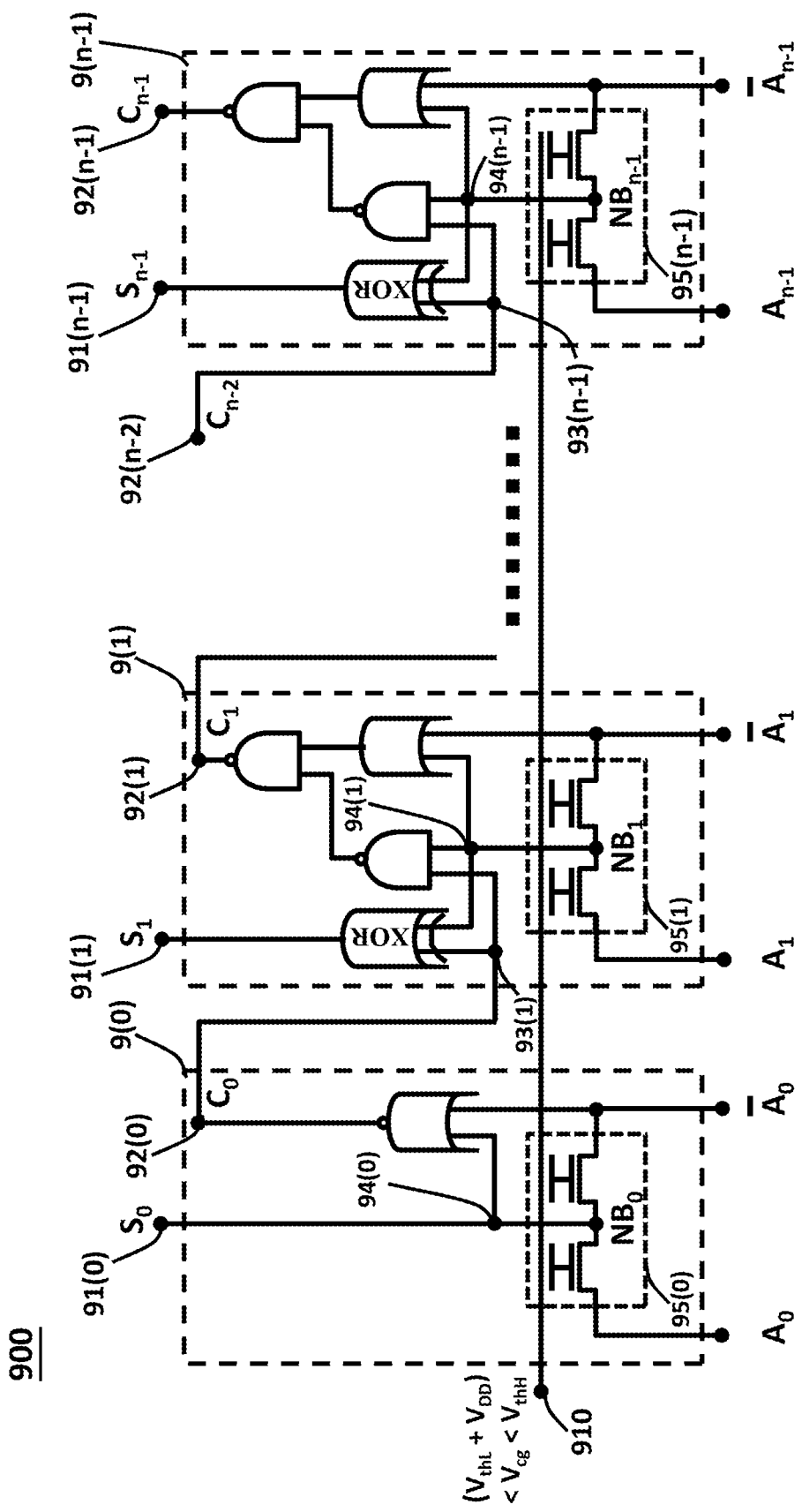
FIG. 9 shows a schematic diagram of an nonvolatile arithmetic memory operator module for an n-bit ripple adder using the SGLNVM devices (disclosed in U.S. Pat. No. 9,048,137 B2) for storing non-volatile data according to an embodiment of the invention.

FIG. 9 shows the schematics of an nonvolatile arithmetic memory operator module (for realizing a n-bit ripple carry adder) 900 applying the SGLNVM devices for the non-volatile data storage. The nonvolatile arithmetic memory operator module for the n-bit ripple carry adder 900 comprises one non-volatile half adder 9(0) for the bit data input $A_0/\overline{A}_0$, and "n-1" non-volatile full adders 9(1), ..., 9(n-1), for the bit data input $A_1/\overline{A}_1$, ..., $A_{n-1}/\overline{A}_{n-1}$. The n-bit non-volatile data for $NB_0$, ..., $NB_{n-1}$ are stored in the complementary pairs of SGLNVM devices 95(0), ..., 95(n-1) in the non-volatile adders 9(0), 9(1), ..., 9(n-1). The complementary pairs of SGLNVM devices 95(0), ..., 95(n-1) are initially erased to a low threshold voltage state $V_{thL}$ (the "high" conductance state as defined in FIG. 4b and FIG. 5b) and can be also programmed to a high threshold voltage state $V_{thH}$ (the "low" conductance state as defined in FIG. 4b and FIG. 5b). According to the defined tables for the adders in FIG. 4b and FIG. 5b, the SGLNVM devices 95(0), ..., 95(n-1) connected with their volatile data input node $A_i$ are programmed to the high threshold voltage state $V_{thH}$ for non-volatile data $NB_i$="1". While the SGLNVM devices connected with their volatile data input node $\overline{A}_i$ are programmed to the high threshold voltage state $V_{thH}$ for non-volatile data $NB_i$="0". When the control gates 910 of SGLNVM devices are biased with the applied voltage $V_{cg}$ for $(V_{thL}+V_{DD})<V_{cg}<V_{thH}$, the SGLNVM devices of the complementary pairs with the low threshold voltage state $V_{thL}$ pass the voltage $V_{DD}$ or 0 V from their input voltage nodes and in the meantime, the other SGLNVM devices of the same complementary pairs with the high threshold voltage state $V_{thH}$ are completely shut off, where $V_{DD}$ denotes a positive digital voltage bias of the SGLNVM devices. Therefore the output logic function of the complementary pairs at each node 94(x) for x=0, 1, ..., n-1, for the input data and the non-volatile data behaves like the logic function of XOR for the two input data operation. It is very straight forward for the nonvolatile arithmetic memory operator module 900 in FIG. 9 to obtain the desired logic voltage signal outputs at nodes 91(0), 91(1), ..., 91(n-1) for the sum bits $S_0, S_1, ..., S_{n-1}$ and the carry-out bit $C_{n-1}$ at the node 92(n-1) for n-bit input volatile data and n-bit configurable non-volatile data.

In an alternative embodiment, the non-volatile half adder 9(0) in the nonvolatile arithmetic memory operator module 900 is replaced by a non-volatile full adder with its carry-in bit set to an initial bit depending on different applications. In a similar manner, the nonvolatile arithmetic memory operator module can be used to realize various types of adders, such as a carry look-ahead adder, a ripple-block carry look-ahead adder, a block carry look-ahead adder, ... etc.

Figure 10:
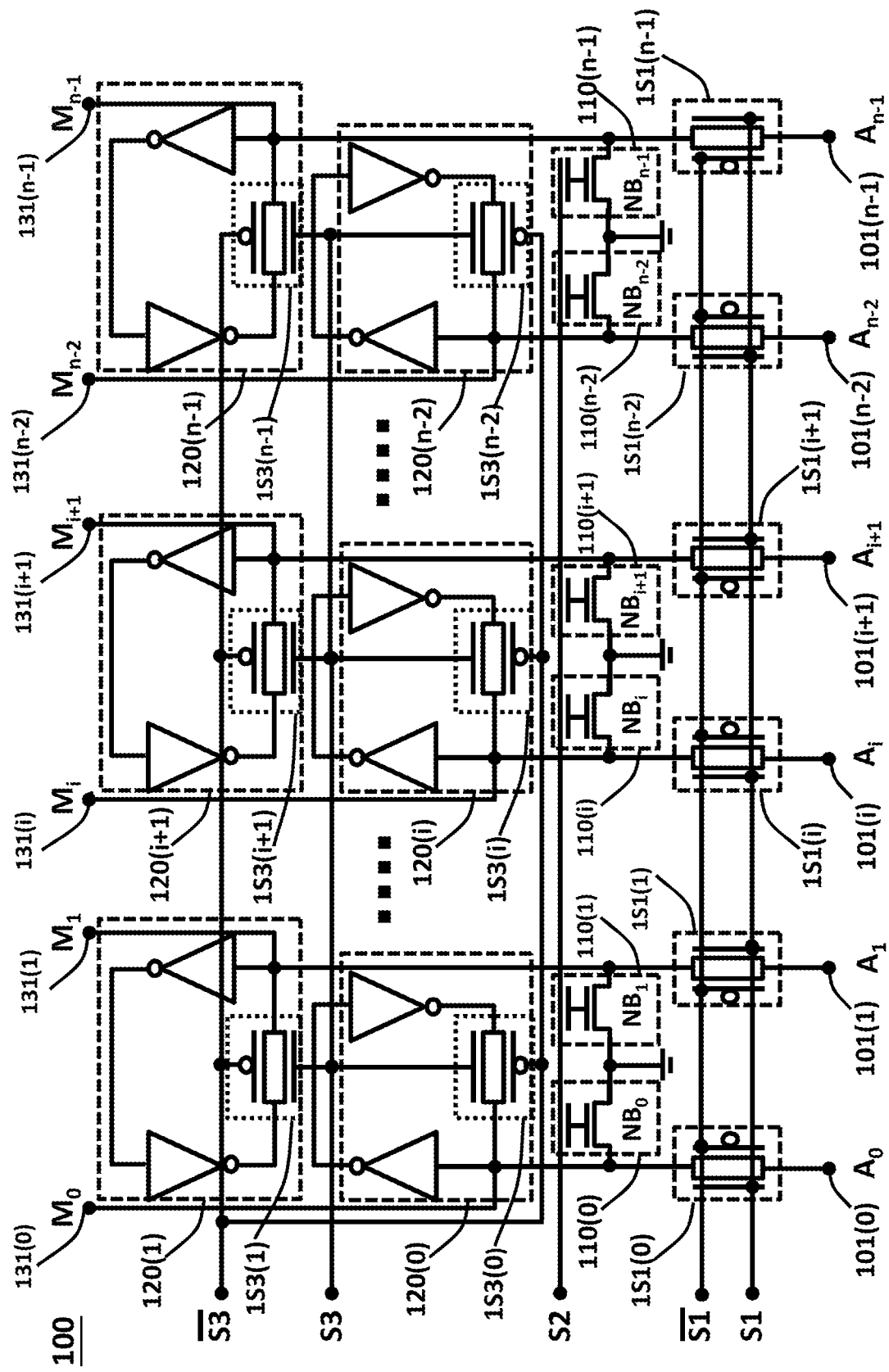

In one embodiment we apply SGLNVM devices to a nonvolatile arithmetic memory operator module for n-bit multiplication as shown in FIG. 10. The nonvolatile arithmetic memory operator module 100 includes "n" non-volatile bit-multiplication units. Each non-volatile bit-multiplication unit "i" comprises (1) a SGLNVM device pair 110(i) for storing a non-volatile bit "i"; (2) a Transmission Gate (TG) switch 1S1(i) for inputting the data voltage signals A; at node 101(i); (3) a TG switch 1S3(i) for closing a latch 120(i) to output the multiplication bit $M_i$ at node 131(i), for i=0, ..., n-1. Meanwhile, all SGLNVM devices are initially erased to the low threshold voltage state $V_{thL}$ as the "high" conductance state defined in FIG. 7c. According to a set of non-volatile data bit string ($NB_0, NB_1, ..., NB_{n-1}$), the SGLNVM devices are also selectively programmed to the high threshold voltage state $V_{thH}$ as the "low" conductance state for $NB_i$="1", while the unselected SGLNVM devices remain in the "low" threshold voltage state $V_{thL}$ as the "high" conductance state for $NB_i$="0".

For the non-volatile/volatile bit-multiplication operation (refer to FIG. 7b), the voltage signals of the volatile data $A_i$ at nodes 101(i) are passed to the latches 120(i) by turning on the TG switches 1S1(i) with applying $V_{DD}$ at nodes S1 and 0 V at the complementary node $\overline{S1}$ with the TG switches 1S3(i) off, for i=0, ..., n-1. After turning off the TG switches 1S1(i) with the TG switches 1S3(i) still off, the control gates of the SGLNVM devices are applied with a voltage pulse $V_{cg}$ with the voltage amplitude $(V_{thL}+V_{DD})<V_{cg}<V_{thH}$ for a short period of time. For $NB_i$="0" (the "low" threshold voltage state $V_{thL}$), the output voltage at the node 131(i) is always 0 V regardless the input voltages for $A_i$ (either by discharging from $V_{DD}$ to 0 V or remaining at 0 V). For $NB_i$="1" (the "high" threshold voltage state $V_{thH}$), the output voltage at the node 131(i) remains the same voltage signals as the input voltages for $A_i$. That is, the voltage signals at the output $M_i$ are ≈$V_{DD}$ and 0 V for ($A_i$="1" and $NB_i$="1") and ($A_i$="0" and $NB_i$="1"), respectively. As the timing sequence shown in FIG. 7b, the TG switches 1S3(i) are turned on to latch the final output data in the latches 120(i) after the control gate voltage pulse $V_{cg}$ is turned off. Finally, the output voltage signals, $V_{DD}$ for logic state "1" and $V_{SS}$ for logic state "0" at node 131(i) for n-bit multiplication $M_i$ are obtained for the bit-multiplication of the input data $A_i$ and the non-volatile data $NB_i$, for $_i$=0, 1, ..., n-1, as the same AND logic gate operations for two input sets of volatile data.

The aforementioned description of the preferred embodiments of the invention has been presented for purposes of illustration and description. It is not intended to be exhaustive or to limit the invention to the precise form or to exemplary embodiments disclosed. Accordingly, the description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A nonvolatile arithmetic memory operator for performing a bit arithmetic operation over a first operand and a second operand, comprising:
   a nonvolatile memory (NVM) cell for pre-storing a first data bit as the first operand; and
   a first input terminal coupled to the NVM cell for receiving a second data bit as the second operand;
   wherein the NVM cell has two conductance states that respectively represent two logic values of the first data bit.

2. The nonvolatile arithmetic memory operator according to claim 1, further comprising:
   a first output terminal; and
   a logic gate circuit connected to the first output terminal and at least one of the NVM cell and the first input terminal for performing the bit arithmetic operation over the first operand and the second operand to generate an output bit at the first output terminal.

3. The nonvolatile arithmetic memory operator according to claim 2, wherein the logic gate circuit comprises:
   a first switch coupled between the first input terminal and the first output terminal;
   a second switch coupled between the NVM cell and the first output terminal;
   a first inverter having an input node coupled to the first output terminal;
   a second inverter having an input node coupled to an output node of the first inverter; and
   a third switch coupled between the first output terminal and an output node of the second inverter;
   wherein the bit arithmetic operation is a bit-multiplication operation.

4. The nonvolatile arithmetic memory operator according to claim 3, wherein the first switch is turned on during a first period, the second switch is turned on during a second period, and the third switch is turned on during a third period, and wherein the first period is followed by the second period, and the second period is followed by the third period.

5. The nonvolatile arithmetic memory operator according to claim 2, wherein the logic gate circuit comprises:
   an inverter coupled between an output node of the NVM cell and the first output terminal;
   wherein the NVM cell is a floating-gate inverter device coupled between the first input terminal and the inverter; and
   wherein the bit arithmetic operation is a bit-multiplication operation.

6. The nonvolatile arithmetic memory operator according to claim 5, wherein the floating-gate inverter device comprises a floating-gate PMOS device and a floating-gate NMOS device that are connected in series and share a common floating gate, wherein drain electrodes of the floating-gate PMOS device and the floating-gate NMOS device form an output node of the NVM cell, and control gates of the floating-gate PMOS device and the floating-gate NMOS device are connected together, and wherein the first input terminal is connected to the control gates of the floating-gate PMOS device and the floating-gate NMOS device.

7. The nonvolatile arithmetic memory operator according to claim 6, wherein source electrodes of the floating-gate PMOS device and the floating-gate NMOS device are respectively connected to an operating voltage node and a ground node.

8. The nonvolatile arithmetic memory operator according to claim 2, further comprising:
   a second input terminal for receiving a third data bit complementary to the second data bit; and
   a second output terminal for generating a carry-out bit;
   wherein the NVM cell comprises a first NVM device and a second NVM device in different conductance states, wherein the first NVM device is connected between the first input terminal and a connecting node, and the second NVM device is connected between the second input terminal and the connecting node.

9. The nonvolatile arithmetic memory operator according to claim 8, wherein the logic gate circuit comprises a NOR gate having a first input node connected to the connecting node, a second input node connected to the second input terminal and an output node connected to the second output terminal, and wherein the connecting node is connected to the first output terminal.

10. The nonvolatile arithmetic memory operator according to claim 9, which is an nonvolatile half adder.

11. The nonvolatile arithmetic memory operator according to claim 8, wherein the logic gate circuit further comprises:
    an OR gate having a first input node connected to the connecting node and a second input node connected to the second input terminal;
    a XOR gate having a first input node receiving a carry-in bit, a second input node connected to the connecting node and an output node connected to the first output terminal;
    a first NAND gate having a first input node receiving the carry-in bit and a second input node connected to the connecting node; and
    a second NAND gate having a first input node connected to an output node of the first NAND gate, a second input node connected to an output node of the OR gate and an output node connected to the second output terminal.

12. The nonvolatile arithmetic memory operator according to claim 11, which is an nonvolatile full adder.

13. The nonvolatile arithmetic memory operator according to claim 1, wherein the NVM cell is re-configurable.

14. An nonvolatile arithmetic memory operator module, comprising:
    N nonvolatile arithmetic memory operators to pre-store N-bit data in N nonvolatile memory (NVM) cells as a first operand and receive N-bit volatile data as a second operand to perform a predefined arithmetic computation over the first operand and the second operand;
    wherein each nonvolatile arithmetic memory operator comprises:
    a corresponding one of the NVM cells for pre-storing a corresponding first bit of the first operand; and
    a first input terminal coupled to the corresponding one of the NVM cells for receiving a corresponding second bit of the second operand;

wherein the NVM cells are arranged in a row to allow their control gates to be applied with a same control gate voltage; and wherein each NVM cell has two conductance states that respectively represent two logic values of its corresponding first bit.

15. The nonvolatile arithmetic memory operator module according to claim 14, wherein the same control gate voltage is greater than $(V_{thL}+V_{DD})$ and less than $V_{thH}$, wherein $V_{thL}$ denotes a low threshold voltage of the NVM cells, $V_{thH}$ denotes a high threshold voltage of the NVM cells and $V_{DD}$ denotes a positive digital voltage bias of the NVM cells.

16. The nonvolatile arithmetic memory operator module according to claim 14, wherein each nonvolatile arithmetic memory operator further comprises:
a first output terminal; and
a logic gate circuit connected to the first output terminal and at least one of the corresponding one of the NVM cells and the first input terminal for performing a bit arithmetic operation corresponding to the predefined arithmetic computation over the corresponding first bit and the corresponding second bit to generate an output bit at the first output terminal.

17. The nonvolatile arithmetic memory operator module according to claim 16, wherein each logic gate circuit comprises:
a first switch coupled between the first input terminal and the first output terminal;
a second switch coupled between the corresponding one of the NVM cells and the first output terminal;
a first inverter having an input node coupled to the first output terminal;
a second inverter having an input node coupled to an output node of the first inverter; and
a third switch coupled between the first output terminal and an output node of the second inverter;
wherein the bit arithmetic computation is a bit-multiplication operation and the predefined arithmetic computation is multiple-bit multiplication.

18. The nonvolatile arithmetic memory operator module according to claim 17, wherein each first switch is turned on during a first period, each second switch is turned on during a second period, and each third switch is turned on during a third period, and wherein the first period is followed by the second period, and the second period is followed by the third period.

19. The nonvolatile arithmetic memory operator module according to claim 16, wherein each logic gate circuit comprises:
an inverter coupled between an output node of the corresponding one of the NVM cells and the first output terminal;
wherein the corresponding one of the NVM cells is a floating-gate inverter device coupled between the first input terminal and the inverter; and
wherein the predefined arithmetic computation is a multiple-bit multiplication and the bit arithmetic operation is a bit-multiplication operation.

20. The nonvolatile arithmetic memory operator module according to claim 19, wherein the floating-gate inverter device comprises a floating-gate PMOS device and a floating-gate NMOS device that are connected in series and share a common floating gate, wherein drain electrodes of the floating-gate PMOS device and the floating-gate NMOS device form an output node of the corresponding one of the NVM cells, and control gates of the floating-gate PMOS device and the floating-gate NMOS device are connected together, and wherein the first input terminal is connected to the control gates of the floating-gate PMOS device and the floating-gate NMOS device.

21. The nonvolatile arithmetic memory operator module according to claim 20, wherein source electrodes of the floating-gate PMOS device and the floating-gate NMOS device are respectively connected to an operating voltage node and a ground node.

22. The nonvolatile arithmetic memory operator module according to claim 16, wherein the N nonvolatile arithmetic memory operators comprise at least (N−1) nonvolatile full adders, wherein a carry-out bit from a previous stage nonvolatile arithmetic memory operator is fed into a carry-in bit of a next stage nonvolatile arithmetic memory operator so that the N nonvolatile arithmetic memory operators are connected in series.

23. The nonvolatile arithmetic memory operator module according to claim 22, wherein each nonvolatile arithmetic memory operator further comprises:
a second input terminal for receiving a third bit complementary to the corresponding second bit of the second operand; and
a second output terminal for generating the carry-out bit;
wherein each NVM cell comprises a first NVM device and a second NVM device in different conductance states, wherein the first NVM device is connected between the first input terminal and a connecting node and the second NVM device is connected between the second input terminal and the connecting node.

24. The nonvolatile arithmetic memory operator module according to claim 23, wherein the N nonvolatile arithmetic memory operators are N nonvolatile full adders, wherein the logic gate circuit for each nonvolatile arithmetic memory operator comprises:
an OR gate having a first input node connected to the connecting node and a second input node connected to the second input terminal;
a XOR gate having a first input node receiving a carry-in bit, a second input node connected to the connecting node and an output node connected to the first output terminal;
a first NAND gate having a first input node receiving the carry-in bit and a second input node connected to the connecting node; and
a second NAND gate having a first input node connected to an output node of the first NAND gate, a second input node is connected to an output node of the NOR gate and an output node connected to the second output terminal.

25. The nonvolatile arithmetic memory operator module according to claim 23, wherein one of the N nonvolatile arithmetic memory operators is a nonvolatile half adder.

26. The nonvolatile arithmetic memory operator module according to claim 25, wherein the logic gate circuit for the one of the N nonvolatile arithmetic memory operators comprises:
a NOR gate having a first input node connected to the connecting node, a second input node connected to the second input terminal and an output node connected to the second output terminal.

27. The nonvolatile arithmetic memory operator module according to claim 14, wherein each NVM cell is re-configurable.

* * * * *